United States Patent
Mishra et al.

(10) Patent No.: US 12,237,845 B2
(45) Date of Patent: Feb. 25, 2025

(54) DEVICES AND METHODS FOR CONSTRUCTING POLAR LIKE CODES

(71) Applicant: Samsung Electronics Co., Ltd., Suwon-si (KR)

(72) Inventors: Samir Kumar Mishra, Bangalore (IN); Digvijay Katyal, Bangalore (IN); Sarvesha Anegundi Ganapathi, Bangalore (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 188 days.

(21) Appl. No.: 17/954,722

(22) Filed: Sep. 28, 2022

(65) Prior Publication Data

US 2023/0098302 A1     Mar. 30, 2023

(30) Foreign Application Priority Data

Sep. 28, 2021    (IN) ............................. 202141044037

(51) Int. Cl.
    *H03M 13/00*      (2006.01)
    *H03M 13/13*      (2006.01)
    *H03M 13/23*      (2006.01)
    *H04J 13/10*      (2011.01)

(52) U.S. Cl.
CPC ......... *H03M 13/23* (2013.01); *H03M 13/136* (2013.01); *H04J 13/10* (2013.01)

(58) Field of Classification Search
None
See application file for complete search history.

(56) References Cited

U.S. PATENT DOCUMENTS

| | | |
|---|---|---|
| 11,283,470 B2 | 3/2022 | Ha et al. |
| 11,418,285 B2 | 8/2022 | Chaki et al. |

(Continued)

FOREIGN PATENT DOCUMENTS

| | | |
|---|---|---|
| CN | 112953552 A | 6/2021 |
| CN | 114584154 A | 6/2022 |

OTHER PUBLICATIONS

Liao, Y. "Construction of Polar Codes with Reinforcement Learning" *Stanford University*, (Sep. 19, 2020). Retrieved from the Internet <URL: https://arxiv.org/abs/2009.09277v1>.

(Continued)

*Primary Examiner* — Mujtaba M Chaudry
(74) *Attorney, Agent, or Firm* — Harness, Dickey & Pierce, P.L.C.

(57) ABSTRACT

A method for constructing Polarization Assisted Convolutional (PAC) codes, the method including passing a codeword through a noisy channel to obtain a first bit and a noise value, determining whether the first bit is an information bit or a non-information bit based on the noise value by decoding the codeword to obtain a decoded codeword, selecting at least one of a reward or a penalty for the first bit based on the decoded codeword, the reward being set based on a probability of decoding, and the selecting selects the penalty for the first bit in response to determining the first bit is incorrectly decoded, and iterating the passing, the determining and the selecting according to Q-values for each state among a plurality of states, at least one of the Q-values corresponding to the first bit.

20 Claims, 9 Drawing Sheets

(56) References Cited

U.S. PATENT DOCUMENTS

| | | | |
|---|---|---|---|
| 2009/0046815 A1* | 2/2009 | Oh | H04H 20/95 |
| | | | 375/340 |
| 2020/0036477 A1 | 1/2020 | Xu et al. | |
| 2020/0343962 A1* | 10/2020 | Kwon | G06N 7/01 |
| 2021/0297094 A1* | 9/2021 | Hamelin | H04L 1/0052 |
| 2022/0029638 A1 | 1/2022 | Kim et al. | |
| 2022/0103291 A1* | 3/2022 | Arikan | H03M 13/3776 |
| 2022/0190957 A1 | 6/2022 | Wu et al. | |
| 2022/0237076 A1 | 7/2022 | Niu et al. | |
| 2023/0179229 A1* | 6/2023 | Yao | H04L 1/0045 |
| | | | 714/786 |

OTHER PUBLICATIONS

Arikan, E. "From Sequential Decoding to Channel Polarization and Back Again" *Bilkent University*. (Aug. 26, 2019) arXiv:1908.09594v1.

* cited by examiner

DEVICES AND METHODS FOR CONSTRUCTING POLAR LIKE CODES

CROSS REFERENCE TO RELATED APPLICATION

This application is based on and derives the benefit of Indian Provisional Application 202141044037, filed on Sep. 28, 2021, the entire contents of which are incorporated herein by reference.

TECHNICAL FIELD

Embodiments disclosed herein relate to polar codes, and more particularly to construction of polar like codes for any given block length.

BACKGROUND

Polar codes are the first provably capacity achieving codes for the class of binary input memoryless symmetric (BMS) channels with low encoding and decoding complexity of order O (N log 2N) for a code of blocklength N. Polar codes are based on channel polarization, where a communication channel is transformed into polarized sub-channels; either completely noisy or noiseless. Information bits are transmitted over a set of noiseless sub-channels, while fixed or frozen bits are sent over the noisy sub-channels. Polar codes are already being used in 5G New Radio (NR) for encoding and decoding of control information.

Polar codes achieve channel capacity asymptotically as the blocklength N of the code approaches infinity. However, for short blocklengths, the performance of polar codes is insufficient. FIG. 1 shows the performance of polar code and its variants for a blocklength N=128 and code rate R=0.5 for a binary input additive white gaussian noise (BI-AWGN) channel. FIG. 1 also shows the BI-AWGN dispersion bound which is the minimum (or lowest) probability of error $\varepsilon^*(N,R)$ that may be achieved on a BI-AWGN channel by using a code of blocklength N and code rate R under maximum likelihood (ML) decoding. A big gap may be observed clearly between the polar code with successive cancellation decoding (SCD) and the dispersion bound. This poor performance may be partly attributed to poor distance properties of polar codes and also the sub-optimality of SCD as compared to ML decoding.

There have been efforts to enhance the performance of polar code for short blocklengths using cyclic redundancy check (CRC)— Aided Polar codes under successive cancellation list (SCL) decoding.

FIG. 1 depicts frame erasure rate (FER) Performance of (128, 64) polar code variants. FIG. 1 also shows the FER performance of a (128, 72) polar code combined with a (72, 64) cyclic code which acts as CRC under SCL decoding with a list size L=32. This approach has been adopted to 5G NR standard and has remained the state of the art ever since.

In the Shannon Lecture at the International Symposium on Information Theory (ISIT) 2019, Arikan presented polarization assisted convolutional (PAC) codes, which are a significant improvement over the state-of-the-art polar codes. Under sequential decoding, the FER performance of PAC codes is just 0.25 dB away from the BI-AWGN dispersion bound approximation at a target FER of $10^{-5}$. Further, it was observed in other works that nearly the same FER performance may be obtained by list decoding as shown in FIG. 1.

The coding scheme of a PAC code is shown in FIG. 2. In FIG. 2, the solid blocks refer to actual blocks used in (e.g., operations performed by) the communication system. The dotted blocks refer to the information provided to these blocks. An example PAC code may be denoted as PAC (N, K, I, w). Here, K is the number of information bits. N is the length of the codeword which is mostly a power of 2. $I \subseteq \{0, 1, \ldots, (N-1)\}$ is the set of information bit indices. w is a precoding vector of length p containing 0s and 1s. R=K/N is the rate of the code. Using the polar code terminology, $F=I^c$ is the set of frozen indices, where no information is transmitted. These indices are filled with zeros.

The first operation of encoding PAC codes is rate-profiling. A rate profiler maps the vector of information bits denoted by $d=[d_0, d_1, \ldots, d_{k-1}]$ to a vector of bits $v=[v_0, v_1, \ldots, v_{N-1}]$ according to I. In other words, the K information bits in d are mapped to positions in v indicated by I. The rest (N−K) positions in v are filled with zeros. The selection of K indices out of N possible indices is called rate-profile construction. Two well-known rate-profiling schemes are polar and Reed-Muller (RM) rate profiles. After rate-profiling, the vector v is transformed into a vector u using a convolutional precoding polynomial w of length p. In other words, each bit in v is replaced by a linear combination of itself and p−1 bits that precede it. This linear combination is decided by w. The final operation of encoding is to pass the precoded vector u through a Polar Transform $P_n$ to output encoded bit vector x $$x=uP_n=uP^{\otimes n}$$

Here, $P_n$ is the $n^{th}$ Kronecker power of the basic polar transform, $$P = \begin{bmatrix} 1 & 0 \\ 1 & 1 \end{bmatrix}$$

In the absence of precoding, w and PAC code falls back to polar code. The decoding of PAC code may be performed either by sequential decoding or by list decoding.

Hence, continuous work is being done to improve on the coding in practical scenarios and to achieve a performance which is close to an ideal performance. The past results showed that achieving a good performance from a practically realizable encoder/decoder is feasible only if the packet length is big. However, the performance goes down if the packet length reduces.

Further, for a given block length and code block length, the challenge arises in choosing optimal (or improved) code sequences which maximizes (or increases) the hamming distance of the polar codes.

SUMMARY

Embodiments provide methods and systems for deriving an optimal (or improved) set of polar like codes for a given input block length and code rate to enhance the performance of an encoder/decoder.

Embodiments provide methods and systems for enhancing the performance of smaller block length information bits under noisy conditions.

Embodiments provide methods and systems for deriving the optimal (or improved) set of polar like codes for a given input block length and code rate, which maximizes (or improves) the performance by minimizing (or reducing) the maximum (or upper limit) Hamming distance.

Embodiments provide methods and systems for deriving the optimal (or improved) set of polar like codes for a given input block length and code rate, which maximizes (or increases) the overall performance through reinforcement learning.

Accordingly, embodiments herein provide methods and systems for deriving an optimal (or improved) set of polar like codes for a given input block length and code rate, which enhances the performance of an encoder/decoder and smaller block length information bits under noisy conditions.

Accordingly, embodiments herein provide a method for constructing at least one Polarization Assisted Convolutional (PAC) code. The method includes passing, by processing circuitry, at least one codeword among a plurality of codewords through a noisy channel to obtain a first bit and a noise value, determining, by the processing circuitry, whether the first bit is an information bit or a non-information bit based on the noise value by decoding the at least one codeword to obtain at least one decoded codeword, selecting, by the processing circuitry, at least one of a reward or a penalty for the first bit based on the at least one decoded codeword, the reward being set based on a probability of decoding, and the selecting selects the penalty for the first bit in response to determining the first bit is incorrectly decoded, and iterating the passing, the determining and the selecting, by the processing circuitry, according to Q-values for each state among a plurality of states, at least one of the Q-values corresponding to the first bit.

Accordingly, embodiments herein provide a device for constructing at least one polarization assisted convolutional (PAC) code. The device includes processing circuitry configured to pass at least one codeword among a plurality of codewords through a noisy channel to obtain a first bit and a noise value, determine whether the first bit is an information bit or a non-information bit based on the noise value by decoding the at least one codeword to obtain at least one decoded codeword, select at least one of a reward or a penalty for the first bit based on the at least one decoded codeword, the reward being set based on a probability of decoding, and the selection includes selecting the penalty for the first bit in response to determining the first bit is incorrectly decoded, and iterate the pass of the at least one codeword, the determination of whether the first bit is the information bit or the non-information bit and the selection of at least one of the reward or the penalty according to Q-values for each state among a plurality of states, at least one of the Q-values corresponding to the first bit.

These and other aspects of embodiments herein will be better appreciated and understood when considered in conjunction with the following description and the accompanying drawings. It should be understood, however, that the following descriptions, while indicating at least one example and numerous specific details thereof, are given by way of illustration and not of limitation. Many changes and modifications may be made within the scope of the examples herein without departing from the spirit thereof, and embodiments herein include all such modifications.

BRIEF DESCRIPTION OF FIGURES

Embodiments disclosed herein are illustrated in the accompanying drawings, throughout which like reference letters indicate corresponding parts in the various figures. Embodiments herein will be better understood from the following description with reference to the drawings, in which.

DETAILED DESCRIPTION

Figure 1:
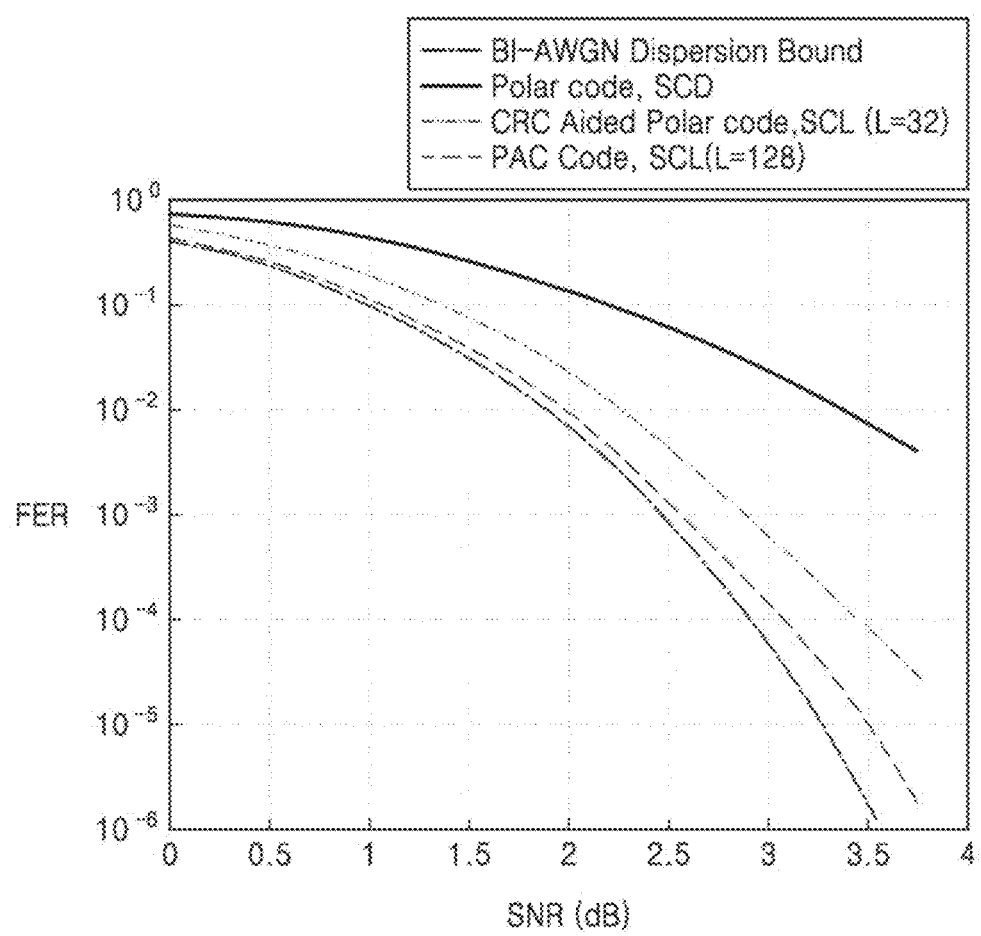
FIG. 1 shows the performance of polar code and its variants for a blocklength N=128 and code rate R=0.5 for a binary input additive white gaussian noise (BI-AWGN) channel and shows the BI-AWGN dispersion bound which is the minimum (or lowest) probability of error $\varepsilon^*(N,R)$ that may be achieved on a BI-AWGN channel by using a code of blocklength N and code rate R under maximum likelihood (ML) decoding, according to prior art.
Figure 2:
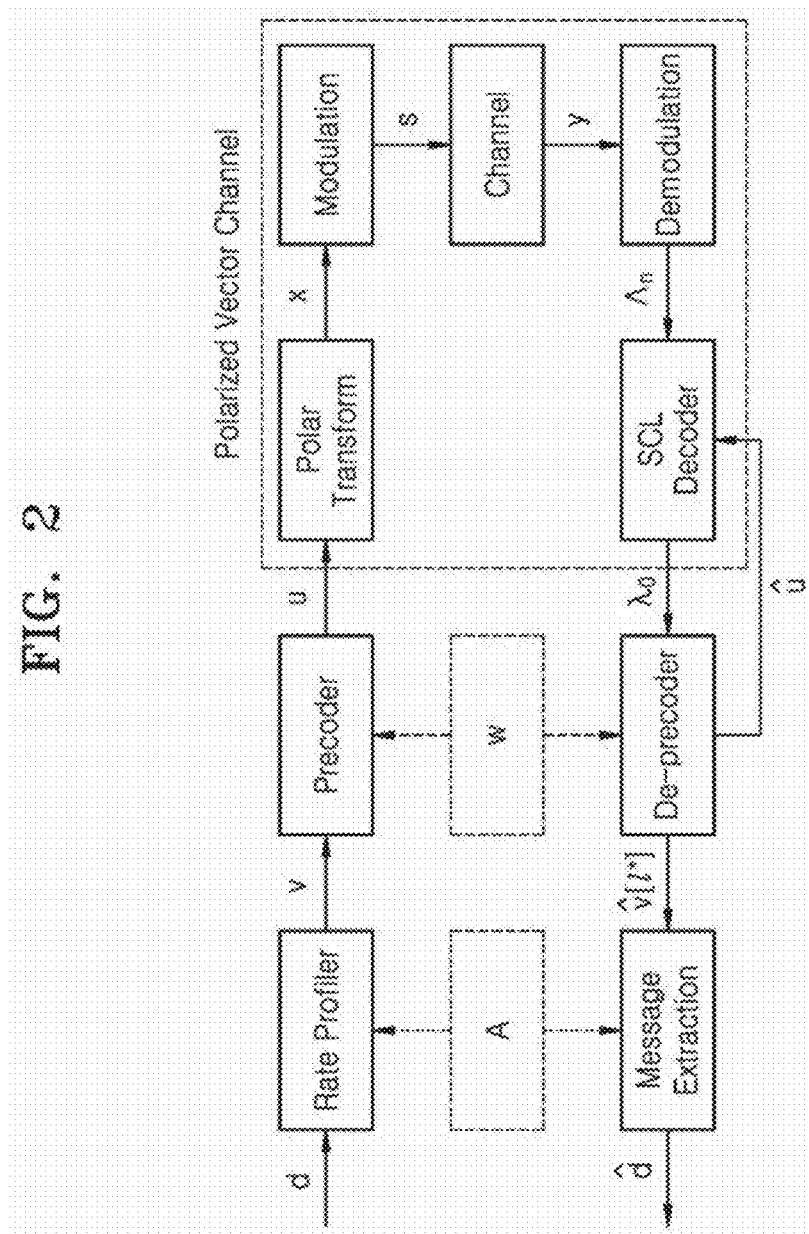
FIG. 2 depicts the coding scheme of a PAC code, according to prior art.

Embodiments herein and the various features and advantageous details thereof are explained more fully with reference to the non-limiting examples that are illustrated in the accompanying drawings and detailed in the following description. Descriptions of well-known components and processing techniques are omitted so as to not unnecessarily obscure embodiments herein. The examples used herein are intended merely to facilitate an understanding of ways in which embodiments herein may be practiced and to further enable those of skill in the art to practice embodiments herein. Accordingly, the examples should not be construed as limiting the scope of embodiments herein.

Embodiments herein achieve methods and systems for deriving an optimal (or improved) set of polar like codes for a given input block length and code rate. Referring now to the drawings, and more particularly to FIGS. 3 through 8, where similar reference characters denote corresponding features consistently throughout the figures, there are shown embodiments.

Figure 3:
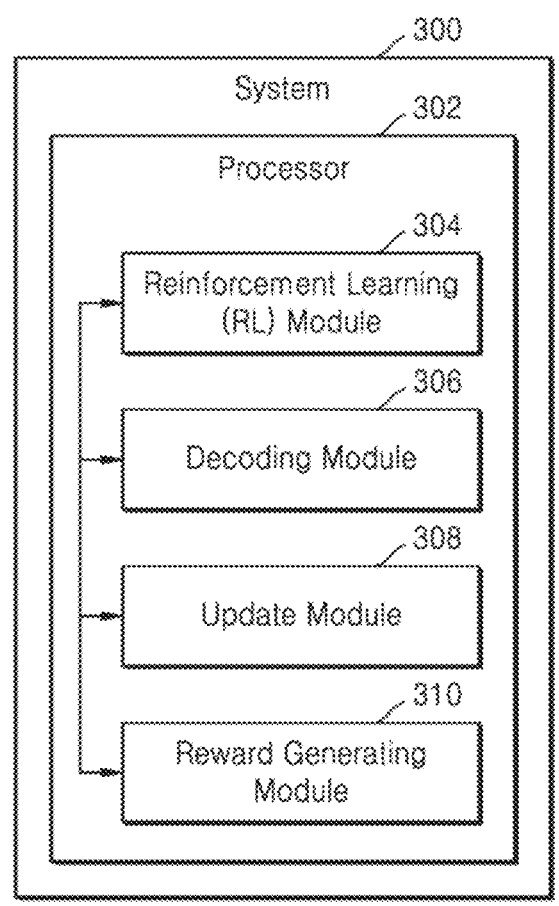
FIG. 3 depicts a device for constructing polarization assisted convolutional (PAC) codes, according to embodiments as disclosed herein.

FIG. 3 depicts a device 300 (also referred to herein as a system 300) which comprises a processor 302 for constructing polarization assisted convolutional (PAC) codes. The processor 302 further comprises a reinforcement learning (RL) module 304, a decoding module 306, an update module 308, and/or a reward generating module 310. The processor 302 may utilize the RL module 304 which implements a Q-learning method for constructing the PAC code. The Q-learning method is a model-free method which learns the value of an action in a particular state.

In embodiments, the processor 302 may be configured to pass at least one codeword from a plurality of codewords through a noisy channel for obtaining a bit and a noise value. The bit value may be determined by its position in the codeword which may be updated in every iteration. The noise value may be determined based on a target signal interference plus noise ratio (SINR) range for which an optimal (or improved) code sequence may be determined. An example of the codeword (e.g., each codeword) may be (e.g., include), but is not limited to an uncoded data length (K), a code rate (K/N (where N is a code word length)) and a precoder.

In embodiments, the processor 302 may determine if the obtained bit is an information bit or a non-information bit. The determination may be carried out by decoding the codeword based on the noise value. The processor 302 may utilize the decoding module 306 to implement an action generation method for determining whether the obtained bit is the information bit or non-information bit, when decoding the codeword. In embodiments, the action generation method may utilize a Reed-Muller (RM) score generation method for sorting RM scores of N information bit indices in an ascending order and dividing the N information bit indices into a plurality of subsets. The plurality of subsets may comprise a first subset of indices, a second subset of indices, and a third subset of indices. For the first subset of indices, whose RM score is less than a boundary RM score, the Q-learning method may take a down action and allocate the first subset of indices to a frozen set (F). For the second subset of indices, whose RM score is greater than the boundary RM score, the Q-learning method may take a right action and allocate the second subset of indices to a set of information bit indices (I). For the third subset of indices, whose RM score is equal to the boundary RM score, the Q-learning method may select an action (a) from (e.g., based on) a current state $s \in S$ using a policy derived from Q (example, ε-greedy).

In embodiments, the processor 302 may be configured to decide (e.g., select, determine, etc.) at least one of a reward and/or a penalty on each bit, by the reward generating module 310, based on the decoded codeword. The reward or penalty may be decided based on the following scenario:
 i) If the decoded bit is same as (or similar to) the transmitted bit or not,
 ii) During decoding, a list of probable candidates is maintained. Partial reward/penalty may also be decided based on the position of the transmitted code word in the probable list.

The bits are set with rewards, wherein the rewards are proportional to their probability of decoding (e.g., based on comparison to at least one threshold probability associated with a corresponding reward, according to a database in which probability values are stored in association with corresponding rewards, as an output of a function based on the probability, etc.); e.g., bits with a higher reward indicate that these bits have a higher probability of decoding (e.g., decoding successfully or correctly, such that the decoded bit is the same as or similar to the transmitted bit) and further, bits with a higher reward are selected in the final code. The remaining bits may be penalized in each iteration. The reward generating module 310 may be configured to allocate at least one of a positive reward, a negative reward, and/or a partial reward/penalty on each bit. The positive reward may be allocated on determining that the bit is correctly decoded. The negative reward (or penalty) may be allocated on determining the bit is incorrectly decoded (e.g., such that the decoded bit is not the same as or similar to the transmitted bit). The partial reward/penalty may be allocated based on the position of all zero codewords from the plurality of codewords in the probable's list.

In embodiments, the processor 302 may utilize the update module 308 to update a value function of the current state action pair using an update strategy method. The update module 308 may update the value function of next action based on the reward/penalty decided for each bit and the previous action. The update strategy method may further update the value function of all the state action pairs taken during an episode when that episode comes to an end and/or when all zero codewords from the plurality of codewords are dropped from the list.

The processor 302 may be further configured to iterate above operations until Q-values for each state are optimal (or improved). A Q-value is a state-action pair for each bit position. It is an indication of bit positions used for an information bit sequence (K) and a frozen bit sequence (N-K).

The Q-values e.g., the action values iteratively improve the behavior of the RL agent. In each iteration, the Q-learning method selects one bit index from Q for which a corresponding PAC code achieves a minimum (or lowest) Hamming distance. According to embodiments, a candidate PAC code may be generated based on each bit index, a Hamming distance determined in connection with each of the candidate PAC codes, and a bit index on which the candidate PAC code having the lowest Hamming distance selected.

In embodiments, the processor 302 may comprise one or more of microprocessors, circuits, and/or other hardware configured for processing. The processor 302 may be at least one of a single processer, a plurality of processors, multiple homogeneous or heterogeneous cores, multiple Central Processing Units (CPUs) of different kinds, microcontrollers, special media, and/or other accelerators. The processor 302 may be an application processor (AP), a graphics-only processing unit such as a graphics processing unit (GPU), a visual processing unit (VPU), and/or an Artificial Intelligence (AI)—dedicated processor such as a neural processing unit (NPU).

FIG. 3 shows example elements of the system 300, but it is to be understood that embodiments are not limited thereon. In embodiments, the system 300 may include a less or a greater number of modules. Further, the labels or names of the modules are used only for illustrative purpose and do not limit the scope of embodiments herein. One or more units (or modules) may be combined together to perform the same or a substantially similar function in the system 300.

In embodiments, the Q-learning method for constructing the PAC code using the RL module 304 is given below. Using the proposed Q-learning method, the RL module 304 may correct its behavior over a time e.g., the RL module 304 may incrementally learn based on the input and expected output over each iteration of input-output pair.

```
Input : N, K
Output: Q
States |S| = (N - K + 1) × (K + 1)
Actions |𝒜| = 2
Reward: S × 𝒜 → ℝ
NextState: S × 𝒜 → S
Q : S × 𝒜 → ℝ
Episodes E ← N
Discounting factor γ ← 1
Learning rate α ∈ [0, 1]
Exploration rate ε ∈ [0, 1]
for ε ← 0 to (E - 1) do
    |   s ← initial state
    |   ℐ_init,𝒩 ← RMScore(N, K)
    |   for k ← 0 to (N - 1) do
    |   |   ℐ_init,𝒩 , a ← Action(Q, ℐ_init,𝒩 , K, k, ε)
    |   |   a_k ← a
    |   |   s' ← NextState(s, a)
    |   |   if k = 0 then
    |   |   |   Transmit all zero codeword through the
    |   |   |_  channel.
    |   |   if a = 0 then
    |   |   |   Decode the k^th bit as if it is a frozen bit.
    |   |   |_  Update the PM list and the survival paths
    |   |   else
    |   |   |   Decode the k^th bit as if it is a non-frozen
    |   |   |   bit. Update the PM list and the survival
    |   |   |   paths. Check if all-zero codeword survives
    |   |   |   in the list.
```

-continued

```
|   |   |   | if all zero codeword dropped then
|   |   |   |   | r ← -2x
|   |   |   |   | Q ← Update(N, K, Q, s, s', a, r, α, γ)
|   |   |   |   | F ← 1
|   |   |   |   |_ break
|   |   |   | else
|   |   |   |   |_ F ← 0
|   |   |_
|   |_ s ← s'
| if F = 0 then
|   |   i ← Get the index of all zero codeword in the
|   |      PM list
|   |   v ← Get the first codeword to the PM list
|   |   s ← initial state
|   |   f ← 0
|   |   for k ← 1 to N do
|   |   |   a ← a_k
|   |   |   s' ← NextState(s, a)
|   |   |   r, f ← Reward(v, k, i, f)
|   |   |   Q ← Update(N, K, Q, s, s', a, r, α, γ)
|   |   |_ s ← s'
|   |_
|_
return Q
```

Embodiments herein disclose a Reinforcement Learning (RL) method which may be implemented by the RL module 304 for rate-profile construction of PAC code, The RL method may be used for any blocklength, rate and/or precoder constraints. The RL module 304 may construct (e.g., generate, calculate, etc.) a rate-profile I for the corresponding (N, K, I, w) PAC code, by mapping polar code construction to a maze traversing game. Embodiments herein use the modified version of the reinforcement learning method e.g., Q-Learning to solve the maze traversing game.

Here, vectors are denoted by boldface lowercase letters a. An element in a vector $\alpha$ at index i is denoted by $\alpha_i$. A set is denoted by A, its cardinality by |A| and its complement by $A^c$.

Viewing Polar Code Construction as a Game:

(N, K) polar code construction is the selection of K non-frozen bit positions out of N bit positions. This selection procedure may be viewed as a maze traversing game in the reinforcement learning setup, where an RL agent tries to find the optimal (or improved) path for the given environment, rewards and set of rules.

Each (N, K) polar code construction problem may be viewed as a maze with N−K+1 rows and K+1 columns. This maze is equivalent (or similar) to an environment in a reinforcement learning problem. Cells of the maze define the states s=(row, col) of the environment. At any time, the RL agent may be in one of the possible state s, where s ∈ S, |S|=(N−K+1)×(K+1). State s=(0,0) is defined as the initial state and state s=(N−K, K) is defined as the terminal state. At each state s, the RL agent may take one of two possible actions a where $\alpha \in A$, |A|=2; e.g., "down" action and "right" action. For each episode, the RL agent may start from the initial state and end at the terminal state by taking in total N steps.

The processor 302 may use Rate-profile construction to select K indices out of N possible indices. Also at each step, the RL agent may select one of the two possible actions; e.g., "down" (a=0) and "right" (a=1) action. In particular, if at $k^{th}$ step, the RL agent selects a down action, then the $k^{th}$ bit corresponds to a frozen bit position and if the RL agent selects a right action, then the $k^{th}$ bit corresponds to a non-frozen/information bit position.

In embodiments, the processor 302 may use an action generation method which may be implemented by the decoding module 306, for determining whether the bit is the information bit or non-information bit, as given below.

```
subroutine Action (Q, $\mathcal{I}_{init}$, $\mathcal{N}$, K, k, ε):
|   if k ∈ $\mathcal{N}$ then
|   |   if |$\mathcal{I}_{init}$| = K then
|   |   |_ a ← 0
|   |   else if |$\mathcal{I}_{init}$| + |$\mathcal{N}$| = K then
|   |   |_ a ← 1
|   |   else
|   |   |   a ← ε-greedy(Q, ε)
|   |   |   if a = 0 then
|   |   |   |_ $\mathcal{N}$ ← $\mathcal{N}$ \ (k)
|   |   |   else
|   |   |   |_ $\mathcal{I}_{init}$ ← $\mathcal{I}_{init}$ ∪ (k)
|   |   |_
|   |_
|   else if k ∈ $\mathcal{I}_{init}$ then
|   |_ a ← 1
|   else
|   |_ a ← 0
|_ return $\mathcal{I}_{init}$, $\mathcal{N}$, a
```

The action generation method may be divided into two main phases. There is a RM score corresponding to each of the N indices as mentioned in the method. In the first phase, the action generation method may implement the RM score generation method using the decoding module 306, as given below, to sort the RM scores of N indices in an ascending order.

```
subroutine RMScore (N, K):
|   t ← 0
|   for j ← 0 to (N − 1) do
|   |_ $t_j$ ← w(j − 1)    // Calculate Rm score
|   u ← sort(t)    // Sort in ascending order
|   $t_b$ ← $u_{N-K}$    // Boundary RM score
|   $\mathcal{I}_{init}$ ← ∅    // Initial rate profile
|   $\mathcal{N}$ ← ∅    // Set of indices with $t_i$ = $t_b$
|   for i ← 0 to (N − 1) do
|   |   if $t_i$ > $t_b$ then
|   |   |_ $\mathcal{I}_{init}$ ← $\mathcal{I}_{init}$ ∪ {i}
|   |   if $t_i$ = $t_b$ then
|   |   |_ $\mathcal{N}$ ← $\mathcal{N}$ ∪ {i}
|   |_
|_ return $\mathcal{I}_{init}$, $\mathcal{N}$
```

Embodiments herein consider the RM score at the $(N-K)^{th}$ index of the sorted set as a boundary RM score. Now, the set of N indices are divided into three subsets. First, for the set of indices whose RM score is less than the boundary RM score, the RL agent may take the down action, e.g., these indices are allocated to the frozen set F or $I^c$. Second, for the set of indices whose RM score is greater than the boundary RM score, the RL agent may take the right action e.g., these indices are allocated to the set of information bit indices I. This set is referred to as the initial rate profile and denoted by $I_{init}$. It is to be noted that $|I_{init}| \leq K$.

Some PAC codes are simplified, when $|I_{init}| \leq K$. The code may be constructed by the first phase of the method. A typical example of this is the (128, 64) PAC code, where the rate-profile construction method falls back to the RM rate-profile.

The set of indices whose RM score is equal to the boundary RM score are considered. Embodiments herein denote this set by N\{$I_{init}$, $I^c$}. This indicates a set of indices which are neither selected as frozen nor selected as information bit positions. In the second phase, the action generation method may select the remaining (K−|$I_{init}$|) indices from available ($|N|-|I_{init}|-|I^c|$) indices in order to create a (N, K) code. For this set of indices, the RL agent may select the action a from the current state s ∈ S using policy derived from Q (e.g., ε-greedy).

Value functions of state action pairs may be updated, using the update strategy method, which may be implemented through the update module 308, wherein either all zero codewords are dropped from the list or the episode comes to an end. In the first case, the value function of the current state action pair may be updated and on the other hand, in the later case, the value function of all the state action pairs taken during that episode may be updated. The update strategy method is given below.

```
subroutine Update (N, K, Q, s, s', a, r, α, γ) :
    if s'₀ = N − K then
        Q(s, a) ← Q(s, a) + α(r + γQ(s', 2) − Q(s, a))
    else if s'₁ = K then
        Q(s, a) ← Q(s, a) + α(r + γQ(s', 1) − Q(s, a))
    else
        Q(s, a) ←
            Q(s, a) + α(r + γmax_a' Q(s', a') − Q(s, a))
    return Q
```

If all zero codewords survive in the list throughout the episode, e.g., F=0, value function Q (s, α) of all the N state action pairs taken during that episode may be updated according to the update strategy method, using the reward generating module 310 which implements the reward generating method as given below.

```
subroutine Reward (v, k, i, f) :
    if v_k = 0 then
        r ← x − z(i − 1)
    else
        r ← −x − z(i − 1)
        if f = 0 then
            r ← r − x
            f ← 1
    return r, f
```

Reward for the $k^{th}$ state action pair may depend on the $k^{th}$ output bit vk (where vk ∈ {0, 1}) and all zero codeword index i (i ∈ [1, L]) in the list. A positive reward of x, defined as a "base" reward is given, if the $k^{th}$ bit is correctly decoded, otherwise a negative reward of −x is given. Based on the all zero codeword index, the reward is dropped by an amount z (i−1), where z is known as the "step" reward and i is the index of all zero codeword in the list at the end of the episode. Also, if the $k^{th}$ bit position corresponds to the first bit error position in output v, the processor 302 may further drop the reward by amount x.

In case, if all zero codewords have been dropped from the list, e.g., F=1, value function Q (s, α) of current state action pair may be updated according to the update strategy method using the reward of −2x.

Figure 4:
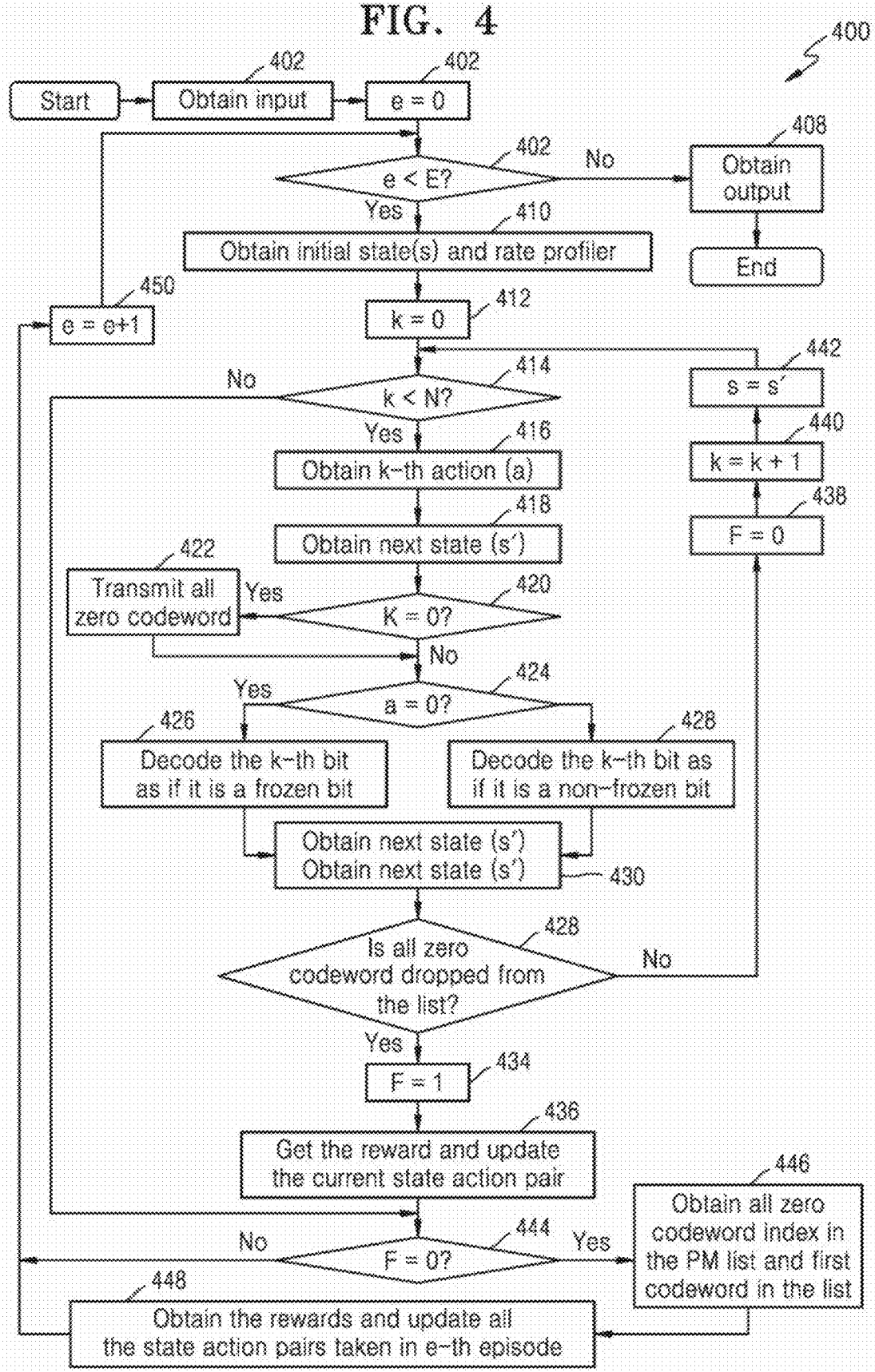
FIG. 4 depicts a flowchart of a Q-learning method for constructing PAC codes by an RL module, according to embodiments as disclosed herein.

FIG. 4 depicts a detailed flowchart 400 of a Q-learning method for constructing PAC codes by the RL module 304, for 'E' total number of episodes. The method starts with obtaining, polar code input bits, as depicted in operation 402. After obtaining the input, an episode 'e' may be considered as '0', as depicted in operation 404. Thereafter, verifying may be carried out to check whether the episode 'e' is less than the total number of episodes 'E', as depicted in operation 406. The RL agent may obtain the output of the polar code bits, in operation 408, and terminates the episode, in case the 'e'th episode is not less than the total number of episodes 'E'.

If the 'e'th episode is less than the total number of episodes 'E', then the RL agent may obtain the initial state(s) and rate profiler for the polar code input bits, as depicted in operation 410. Subsequently, considering (e.g., initializing) the information bit (e.g., the information bit index) 'k' as '0', as depicted in operation 412. Later, the information bit 'k' may be verified to check whether 'k' is less than 'N' possible bit indices, as depicted in operation 414.

If the information bit 'k' is less than 'N' possible bit indices, then k th state action pair 'a' may be obtained, as depicted in operation 416. Thereafter, the next state 's' may be obtained, as depicted in operation 418, after obtaining the action 'a' for the k th state. Subsequently, verification may be carried out to check whether the information bit (e.g., a value of the information bit) 'K' is 0, as depicted in operation 420. If the information bit 'K' is '0', then an all zero codeword may be transmitted over a binary input additive white gaussian noise (BI-AWGN) channel, as depicted in operation 422. If the information bit 'K' is not '0', then verification may be carried out to check whether the action 'a' is 0, as depicted in operation 424. If the action 'a' is 0, the 'k'th information bit may be decoded as if it is a frozen bit, as depicted in operation 426. If the action 'a' is not 0, the 'k'th information bit may be decoded as if it is a non-frozen bit, as depicted in operation 428. Later, the path metric (PM) list and survival paths may be updated, as depicted in operation 430, with a number of possible candidates from the decoded frozen and non-frozen bits. Further, a check may be carried out to verify whether all zero codeword is dropped from the list, as depicted in operation 432. If all zero codeword is dropped from the list, e.g., F=1, as depicted in operation 434, then rewards for the information bits may be generated and value function Q(s, a) of all the N state action pairs taken during that episode updated according to the update strategy method, using the reward generating method as depicted in operation 436. If all zero codeword survives in the list throughout the episode then F may be set as 0 e.g., F=0, as depicted in operation 438, then the 'k'th information bit may be updated (e.g., incremented) as 'k+1' as depicted in operation 440 and state 's' may be updated to the next state 's' as depicted in operation 442, and operation of 414 of verifying whether 'k' is less than 'N' possible bit indices may be repeated.

If the information bit index 'k' is not less than 'N' possible bit indices as verified at operation 414, and/or the value function Q(s, a) of all the N state action pairs are rewarded and updated at operation 436, then a verification may be carried out to check whether all zero codeword survives in the list throughout the episode e.g., F=0 as depicted in operation 444. If all zero codeword survives in the list throughout the episode e.g., F=0, then all zero codeword index in the PM list and first codeword in the list may be obtained, as depicted in operation 446. Later, rewards for the information bits may be generated and value function Q(s, a) of all the N state action pairs taken during the e-th episode may be updated according to the update strategy method, using the reward generating method, as depicted in operation 448. After rewarding and updating, and if all zero codeword is dropped from the list throughout the episode, e.g., F is equal to 1, then the next episode may be implemented, e.g., e=e+1, as depicted in operation 450 and the operation 406 may be repeated.

The various operations in method 400 may be performed in the order presented, in a different order, simultaneously or contemporaneously. Further, in embodiments, some operations listed in FIG. 4 may be omitted.

Figure 5:
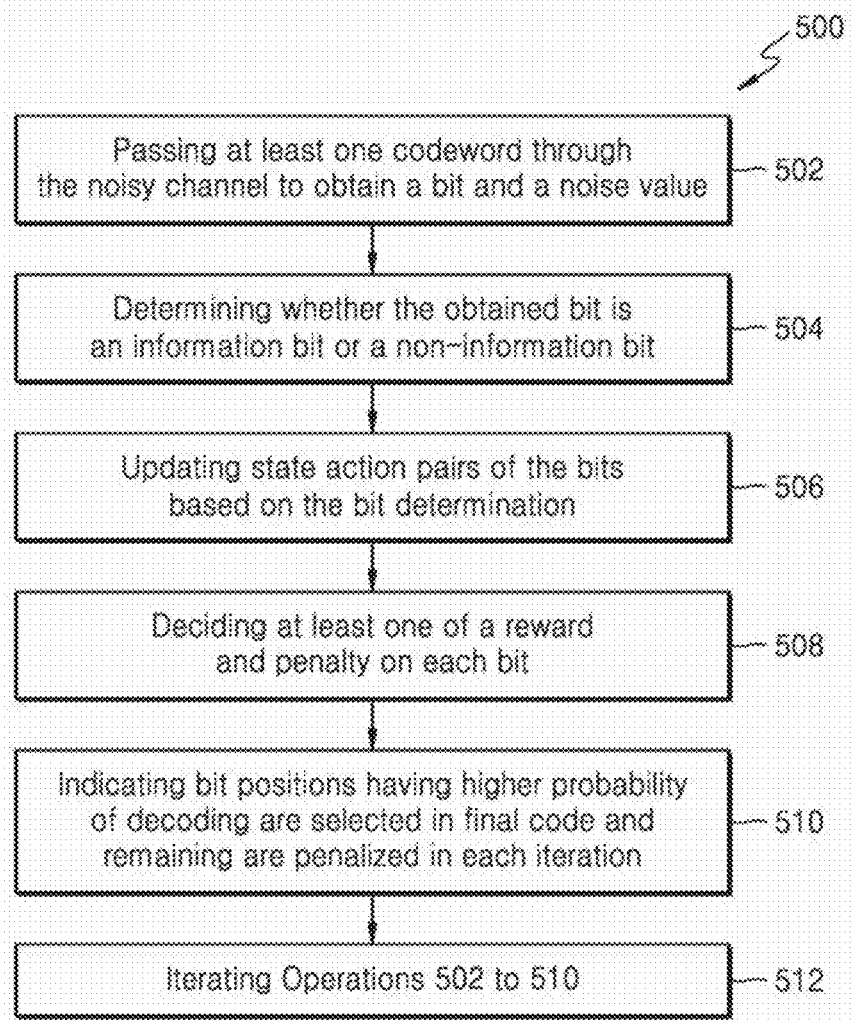
FIG. 5 depicts a method for constructing PAC codes, according to embodiments as disclosed herein.

FIG. 5 depicts a method 500 for constructing (e.g., generating, calculating, etc.) PAC codes. In embodiments, the method 500 begins with passing, by the RL module 304 of the processor 302, at least one codeword from a plurality of codewords through the noisy channel for obtaining a bit and a noise value, as depicted in operation 502. The processor 302 may pass the codeword to the RL module 304 which may implement the Q-learning method. Subsequently, the method 500 discloses determining, by the decoding module 306 of the processor 302, whether the obtained bit is an information bit or a non-information bit based on the noise value, as depicted in operation 504. The bit determination may be carried out by decoding the codeword using the decoding module 306 which may implement the action generation method.

Thereafter, the method 500 discloses updating, by the update module 308 of the processor 302, state action pairs of the bits based on the bit determination, when an episode of the state action pairs comes to an end and/or when all zero codewords from the plurality of codewords are dropped from the list, as depicted in operation 506. Later, the method 500 discloses deciding, by the reward generating module 310 of the processor 302, at least one of a reward and/or a penalty on each bit, as depicted in operation 508. The rewards and penalties may be decided using the reward generating module 310.

Next, the method 500 discloses indicating through rewards that bit positions having higher probability of decoding are selected in final code and remaining are penalized in each iteration, as depicted in operation 510. Thereafter, the method 500 discloses iterating the above operations, by the processor 302, until Q-values for each state are optimal (or improved), as depicted in operation 512. According to embodiments, the processor 302 may iterate the above operations until Q-values for each state exceed a threshold level, satisfy a condition, etc. According to embodiments, the processor 302 may generate a communication signal based on a PAC code generated according to the method 500 (e.g., by encoding a signal with the PAC code), and may transmit the communication signal to at least one other device via a communication channel.

The various operation in method 500 may be performed in the order presented, in a different order, simultaneously or contemporaneously. Further, in embodiments, some operations listed in FIG. 5 may be omitted.

Simulation Results:

For simulation, a (64, 32) PAC code transmitted over a BI-AWGN channel is considered, for which the rate-profile A was constructed using the proposed method. The convolutional precoding polynomial used is w=[1,1,1,1,0,0,1]. The minimum (or lowest) Hamming weight of this code is 8 and there are 8 codewords with this weight.

Figure 6:
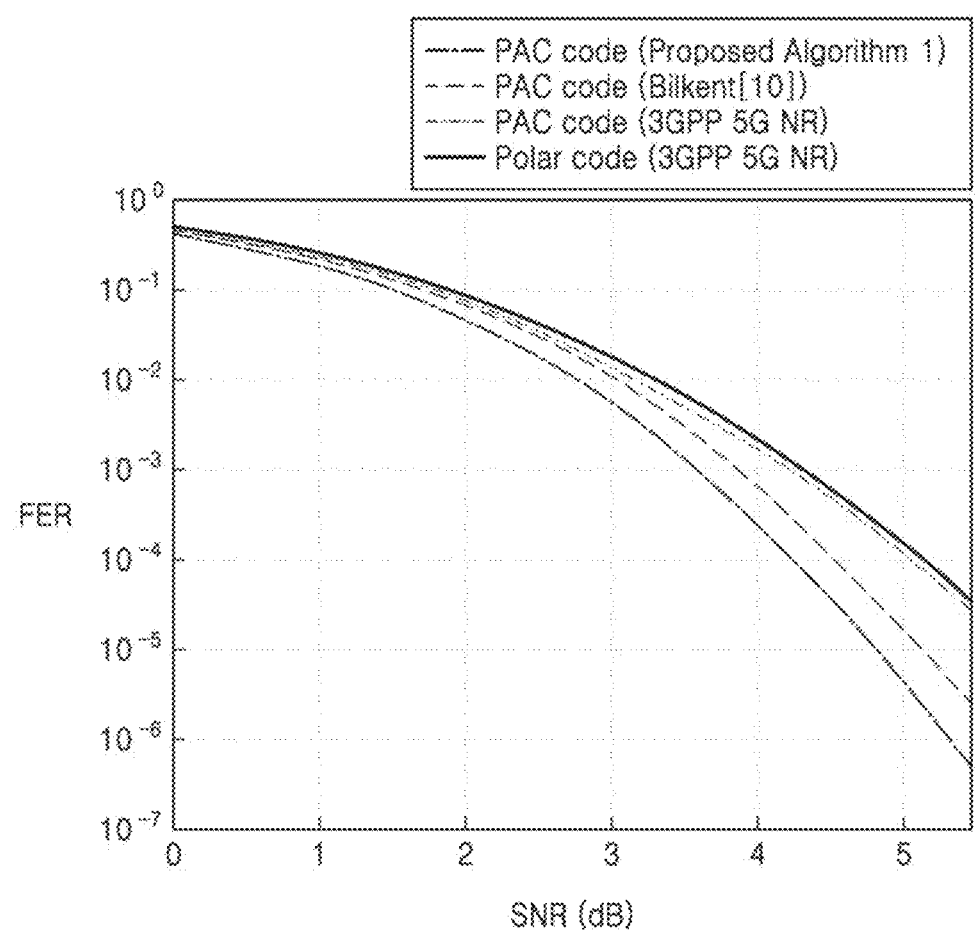
FIGS. 6-9 depict simulation results, according to embodiments as disclosed herein.

FIG. 6 shows the FER performance of existing polar code and PAC code variants compared with that of the PAC code constructed using embodiments disclosed herein. For each code, SCL decoder with list size L=8 was used. It is observed that the PAC code with rate-profile based on 3GPP 5G NR specification only marginally improves the FER performance. Further, it may be easily observed that the PAC code constructed using embodiments herein outperforms all contemporary PAC code constructions at all values of signal-to-noise ratio (SNR). Specifically, at a target FER of $10^{-5}$, the performance of the code is around 0.3 dB better than that presented in other solutions.

Figure 7:
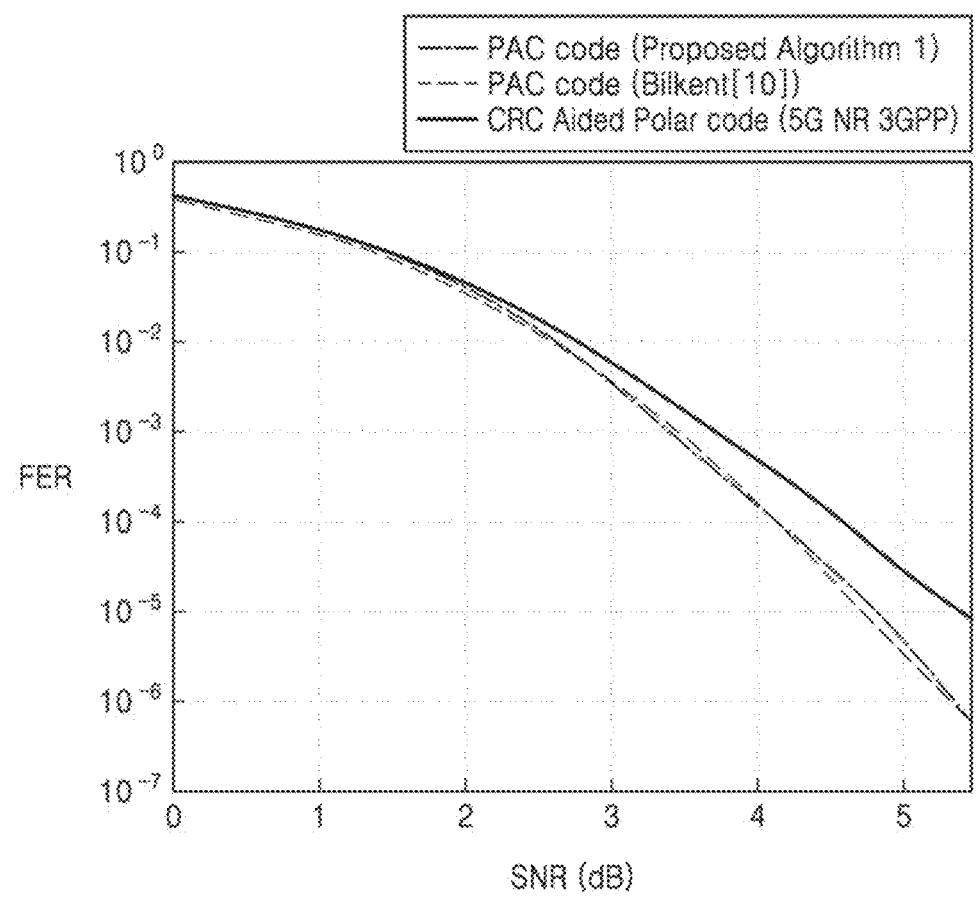

FIG. 7 shows (64, 32) PAC code variants transmitted over a BI-AWGN channel, but using a convolution precoding polynomial given by w=[1,1,0,1,0,0,0,1,0,0,1]. For each code, SCL decoder with list size L=8 is used. In this case, the PAC code constructed with the proposed method marginally outperforms the PAC code constructed with other existing methods for the range of SNR below 5 dB. PAC code constructed with both constructions performs nearly same at high SNRs beyond 5 dB.

Figure 8:
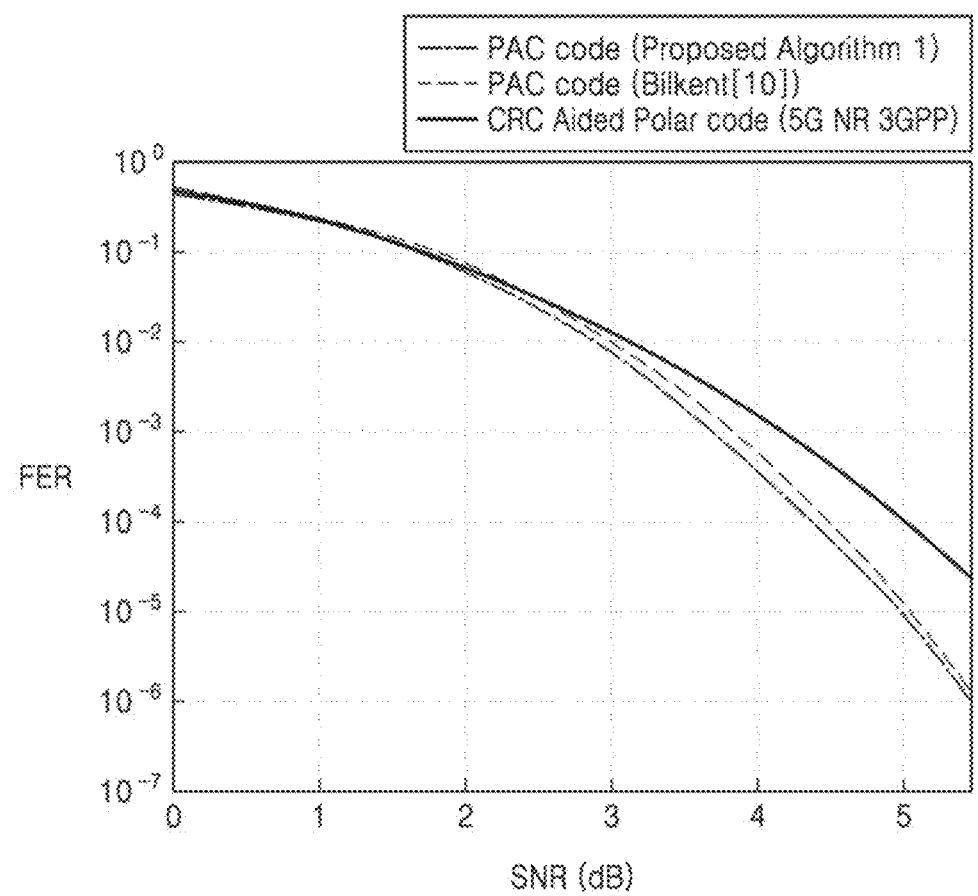

FIG. 8 shows (64, 32) PAC code variants with same parameters as (or similar parameters to) those shown in FIG. 7. However, a SCL decoder with list size L=32 has been used. Further, the PAC code variants are compared with the current state-of-the-art 8-bit CRC-Aided (64, 32) Polar code used in 3GPP 5G NR which contains 24 information bits and 8 CRC-bits. It may be observed that both the PAC code variants perform nearly same. Specifically, at a target FER of $10^{-5}$, the performance of both the codes is around 0.6 dB which is better than the CRC-Aided Polar code.

From the above mentioned results, it may be observed that the PAC codes constructed with the rate-profiling method performs well for a wide range of list sizes. Further, it should be noted that, when using the proposed method, the choice of the convolutional precoding polynomial w may have a significant impact on the performance of the PAC code. Considering a target FER of $10^{-5}$, it may be noted that the PAC code constructed with the proposed method for w=[1, 1, 1, 1, 0, 0, 1] performs around 0.2 dB better than the PAC code constructed with the proposed method for w=[1,1,0,1, 0,0,0,1,0,0,1].

Figure 9:
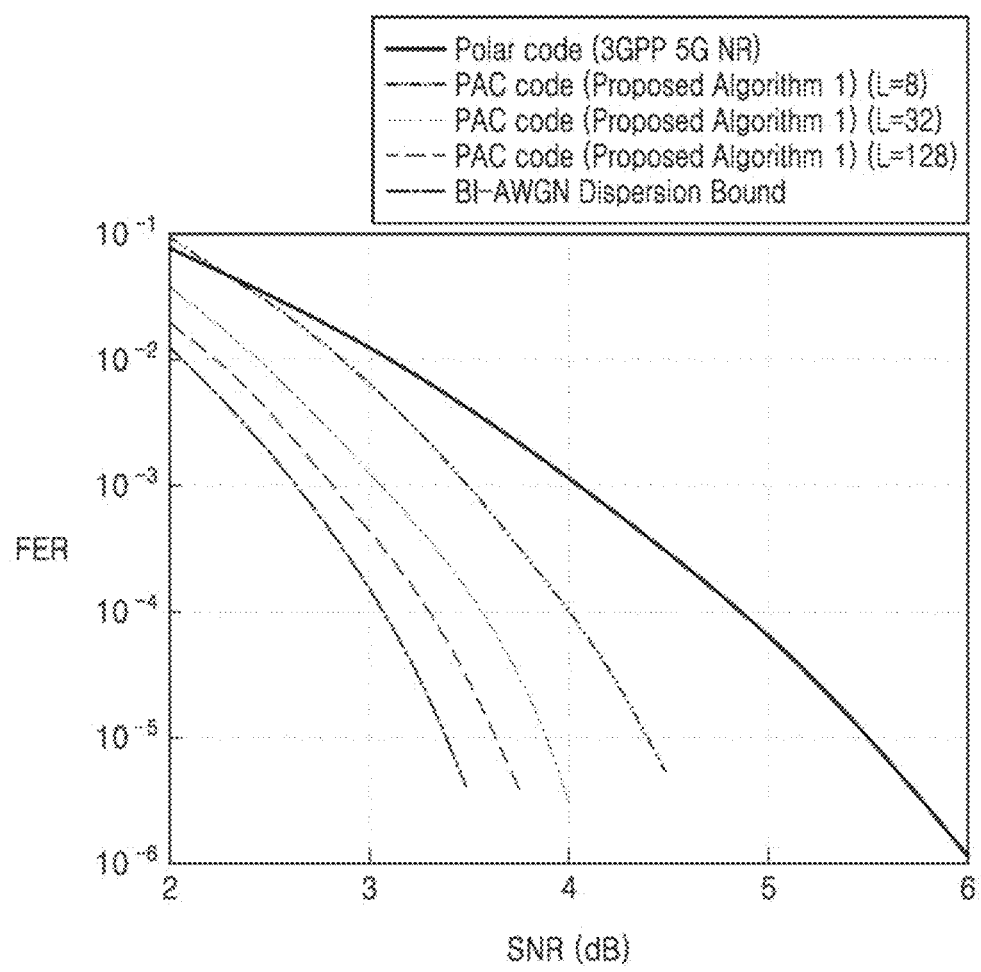

FIG. 9 shows the FER performance of (128, 72) PAC code transmitted over a BI-AWGN channel for which the rate-profile A was constructed using the proposed Q-learning method. The convolutional precoding polynomial used is w=[1, 0, 1, 1, 0, 1, 1].

The minimum (or lowest) Hamming weight of this code is 12 and there are 684 codewords with this weight. It may be observed that with increasing list length L of the SCL decoder, FER performance of the (128, 72) PAC code improves. Specifically, at a target FER of $10^{-5}$, when decoded with a SCL decoder with list length L=128, the FER performance of this PAC code is just 0.35 dB away from the BI-AWGN dispersion bound approximation.

Embodiments herein compare the PAC code constructed with the proposed method with the PAC codes currently available to validate the method. Simulation results show that the PAC codes with the proposed rate-profile construction perform better in terms of frame erasure rate (FER) compared to the PAC codes with existing rate profiling designs. Further, the simulation results show that by adopting the suitable reward strategy, the current state-of-the-art polar and PAC code constructions may be outperformed.

Table 1 provides the rate-profiles that are obtained by the proposed method 500 and used to generate the simulation results described above.

TABLE 1

| (N, K) | Precoder w (binary) | Rate Profiles A (hexadecimal) |
|---|---|---|
| (64, 32) | 1111001 | 0015037F035F17FF |
|  | 111010001001 | 0013117F135717FF |
| (128, 72) | 1011011 | 0001011F01771F7F131737FF177F7FFB |

The proposed system may be applicable for all block lengths of information bits, and is especially suited for smaller lengths which is mainly seen in Internet of things (IoT)/machine type communication (MTC) kind of devices/applications and short packet applications. Thus, this enables device deployments in new areas including low signal places.

Embodiments disclosed herein may be implemented through at least one software program running on at least one hardware device and performing network management functions to control the modules. The module(s) shown in FIG. 3 may be at least one of a hardware device, or a combination of hardware device and software module.

Conventional devices and methods for performing polarization-based communication experience low performance (e.g., channel capacity, frame erasure rate, etc.) at lower block lengths and/or with shorter packets, and thus, provide insufficient communication performance in such circumstances. As such, the conventional devices and methods are unsuitable for implementation scenarios involving such lower block lengths and/or shorter packets, e.g., IoT and/or MTC applications.

However, according to embodiments, improved devices and methods are provided for performing polarization-based communication. For example, the improved devices and methods may provide an iterative Q-learning method to construct a rate profile for a polarization assisted convolutional (PAC) code by mapping polar code construction to a maze traversing game. The communications based on the resulting PAC code experience improved performance (e.g., channel capacity, frame erasure rate, etc.) with respect to those of the conventional devices and methods, especially at lower block lengths and/or with shorter packets. Therefore, the improved devices and method overcome the deficiencies of the conventional devices and methods to at least improve communication performance, especially in implementation scenarios involving such lower block lengths and/or shorter packets, e.g., IoT and/or MTC applications.

According to embodiments, operations described herein as being performed by the device 300, the processor 302, the RL module 304, the decoding module 306, the update module 308 and/or the reward generating module 310 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The various operations of methods described above may be performed by any suitable device capable of performing the operations, such as the processing circuitry discussed above. For example, as discussed above, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing description of the specific examples will so fully reveal the general nature of embodiments herein that others may, by applying current knowledge, readily modify and/or adapt for various applications such specific examples without departing from the generic concept, and, therefore, such adaptations and modifications should and are intended to be comprehended within the meaning and range of equivalents of embodiments. It is to be understood that the phraseology or terminology employed herein is for the purpose of description and not of limitation. Therefore, while embodiments herein have been described in terms of at least one example, those skilled in the art will recognize that the examples herein may be practiced with modification within the scope of embodiments as described herein.

We claim:

1. A method for constructing at least one Polarization Assisted Convolutional (PAC) code, the method comprising:
    passing, by processing circuitry, at least one codeword among a plurality of codewords through a noisy channel to obtain a first bit and a noise value;
    determining, by the processing circuitry, whether the first bit is an information bit or a non-information bit based on the noise value by decoding the at least one codeword to obtain at least one decoded codeword;
    selecting, by the processing circuitry, at least one of a reward or a penalty for the first bit based on the at least one decoded codeword, the reward being set based on a probability of decoding, and the selecting selects the penalty for the first bit in response to determining the first bit is incorrectly decoded; and
    iterating the passing, the determining and the selecting, by the processing circuitry, according to Q-values for each state among a plurality of states, at least one of the Q-values corresponding to the first bit.

2. The method as claimed in claim 1, wherein each of the plurality of codewords comprises an uncoded data length (K), a code rate (K/N, where N is a code word length) and a precoder.

3. The method as claimed in claim 1, wherein the method further comprises:
    performing, by the processing circuitry, a Q-learning method for constructing the at least one PAC code.

4. The method as claimed in claim 1, wherein the determining whether the first bit is the information bit or the non-information bit comprises:
    sorting Reed-Muller (RM) scores of N information bit indices in an ascending order, N being a length of a first codeword among the at least one codeword, and
    dividing the N information bit indices into a plurality of subsets.

5. The method as claimed in claim 4, wherein
    the plurality of subsets comprises a first subset of indices, a second subset of indices, and a third subset of indices, the first subset of indices having an RM score less than a boundary RM score, the second subset of indices having an RM score greater than the boundary RM score, and the third subset of indices having an RM score equal to the boundary RM score; and the method further comprises:
allocating the first subset of indices to a frozen set,
allocating the second subset of indices to a set of information bit indices, and
selecting an action for the third subset of indices based on a current state among the plurality of states and a policy.

6. The method as claimed in claim 5, further comprising:
updating a value function of a current state action pair based on the selecting at least one of the reward or the penalty; and
updating a respective value function of all state action pairs taken during an episode based on termination of the episode or removal of all zero codewords among the plurality of codewords from a list.

7. The method as claimed in claim 1, further comprising:
selecting, by the processing circuitry, one bit index in each iteration for which a corresponding PAC code achieves a minimum Hamming distance.

8. The method as claimed in claim 1, wherein the selecting at least one of the reward or the penalty comprises:
allocating a reward in response to determining that the first bit is correctly decoded; and
a partial reward or a partial penalty based on a position of all zero codewords among the plurality of codewords in a list.

9. A device for constructing at least one polarization assisted convolutional (PAC) code, the device comprising:
processing circuitry configured to:
pass at least one codeword among a plurality of codewords through a noisy channel to obtain a first bit and a noise value,
determine whether the first bit is an information bit or a non-information bit based on the noise value by decoding the at least one codeword to obtain at least one decoded codeword,
select at least one of a reward or a penalty for the first bit based on the at least one decoded codeword, the reward being set based on a probability of decoding, and the selection includes selecting the penalty for the first bit in response to determining the first bit is incorrectly decoded, and
iterate the pass of the at least one codeword, the determination of whether the first bit is the information bit or the non-information bit and the selection of at least one of the reward or the penalty according to Q-values for each state among a plurality of states, at least one of the Q-values corresponding to the first bit.

10. The device as claimed in claim 9, wherein each of the plurality of codewords comprises an uncoded data length (K), a code rate (K/N, where N is a code word length) and a precoder.

11. The device as claimed in claim 9, wherein the processing circuitry is configured to perform a Q-learning method for constructing the at least one PAC code.

12. The device as claimed in claim 11, wherein the processing circuitry is configured to determine whether the first bit is the information bit or the non-information bit by:
sorting Reed-Muller (RM) scores of N information bit indices in an ascending order, N being a length of a first codeword among the at least one codeword, and
dividing the N information bit indices into a plurality of subsets.

13. The device as claimed in claim 12, wherein
the plurality of subsets comprises a first subset of indices, a second subset of indices, and a third subset of indices, the first subset of indices having an RM score less than a boundary RM score, the second subset of indices having an RM score greater than the boundary RM score, and the third subset of indices having an RM score equal to the boundary RM score; and
the processing circuitry is configured to:
allocate the first subset of indices to a frozen set,
allocate the second subset of indices to a set of information bit indices, and
select an action for the third subset of indices based on a current state among the plurality of states and a policy.

14. The device as claimed in claim 13, wherein the processing circuitry is configured to:
update a value function of a current state action pair based on the selection of the at least one of the reward or the penalty; and
update a respective value function of all state action pairs taken during an episode based on termination of the episode or removal of all zero codewords among the plurality of codewords from a list.

15. The device as claimed in claim 9, wherein the processing circuitry is configured to select one bit index in each iteration for which a corresponding PAC code achieves a minimum Hamming distance.

16. The device as claimed in claim 9, wherein the processing circuitry is configured to select the at least one of the reward or the penalty including:
allocating the reward in response to determining that the first bit is correctly decoded, and
allocating a partial reward or a partial penalty based on a position of all zero codewords among the plurality of codewords in a list.

17. The method as claimed in claim 1, further comprising:
generating, by the processing circuitry, a communication signal based on the at least one PAC code.

18. The method as claimed in claim 17, further comprising:
transmitting, by the processing circuitry, the communication signal to at least one device via a communication channel.

19. The device as claimed in claim 9, wherein the processing circuitry is configured to generate a communication signal based on the at least one PAC code.

20. The device as claimed in claim 19, wherein the processing circuitry is configured to transmit the communication signal to at least one other device via a communication channel.

* * * * *